(12) United States Patent
Kurihara

(10) Patent No.: US 6,574,139 B2
(45) Date of Patent: Jun. 3, 2003

(54) METHOD AND DEVICE FOR READING DUAL BIT MEMORY CELLS USING MULTIPLE REFERENCE CELLS WITH TWO SIDE READ

(75) Inventor: Kazuhiro Kurihara, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/052,484

(22) Filed: Jan. 18, 2002

(65) Prior Publication Data

US 2003/0081458 A1 May 1, 2003

Related U.S. Application Data

(60) Provisional application No. 60/300,916, filed on Jun. 20, 2001.

(51) Int. Cl.⁷ .......................... G11C 16/04; G11C 16/06
(52) U.S. Cl. .............................. 365/185.03; 365/185.2; 365/185.24
(58) Field of Search ....................... 365/185.03, 185.18, 365/185.2, 185.24, 185.26; 257/315, 316

(56) References Cited

U.S. PATENT DOCUMENTS

| 5,414,693 | A | * | 5/1995 | Ma et al. ..................... 257/315 |
| 5,949,711 | A | * | 9/1999 | Kazerounian .......... 365/185.03 |
| 6,438,031 | B1 | * | 8/2002 | Fastow .................. 365/185.18 |

* cited by examiner

*Primary Examiner*—Trong Phan
(74) *Attorney, Agent, or Firm*—Sheppard Mullin Richter & Hampton LLP

(57) ABSTRACT

A method for reading at least one programmed dual bit memory cell using a plurality of programmed dual bit reference cells. The reference cells are programmed with selected parameters to compensate for changes in the memory cell. The memory cell is read and compared to data in the reference cells to determine the memory cell data. Thus, changes to the memory cell over time are accounted for by programming the reference cells using the selected parameters.

12 Claims, 10 Drawing Sheets

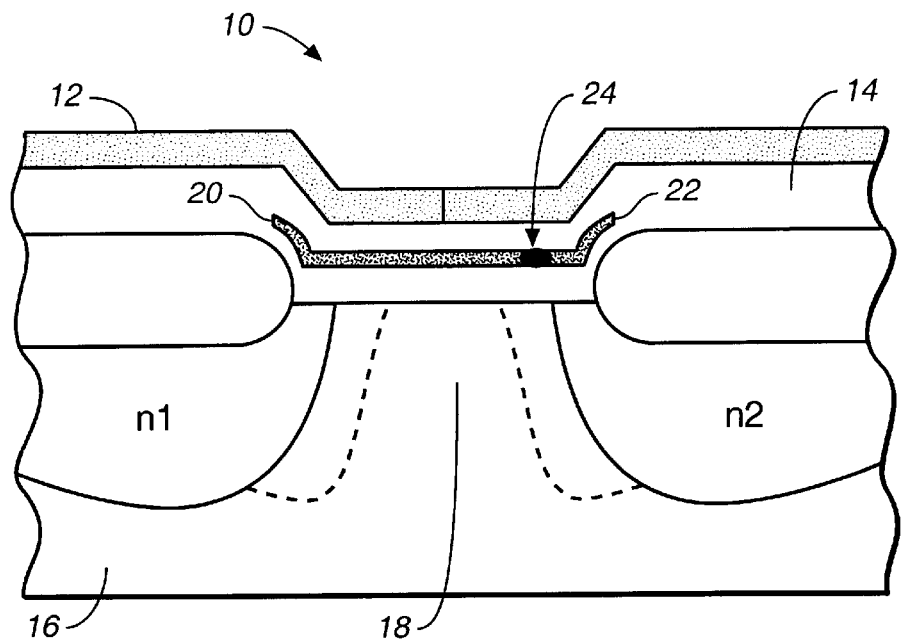
FIG._1
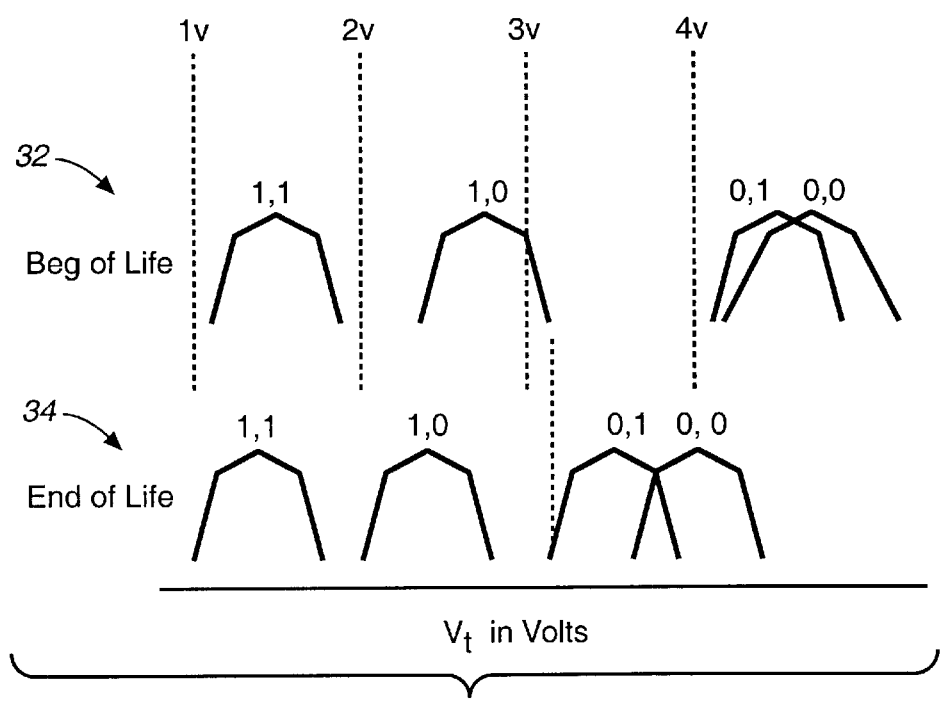
FIG._3

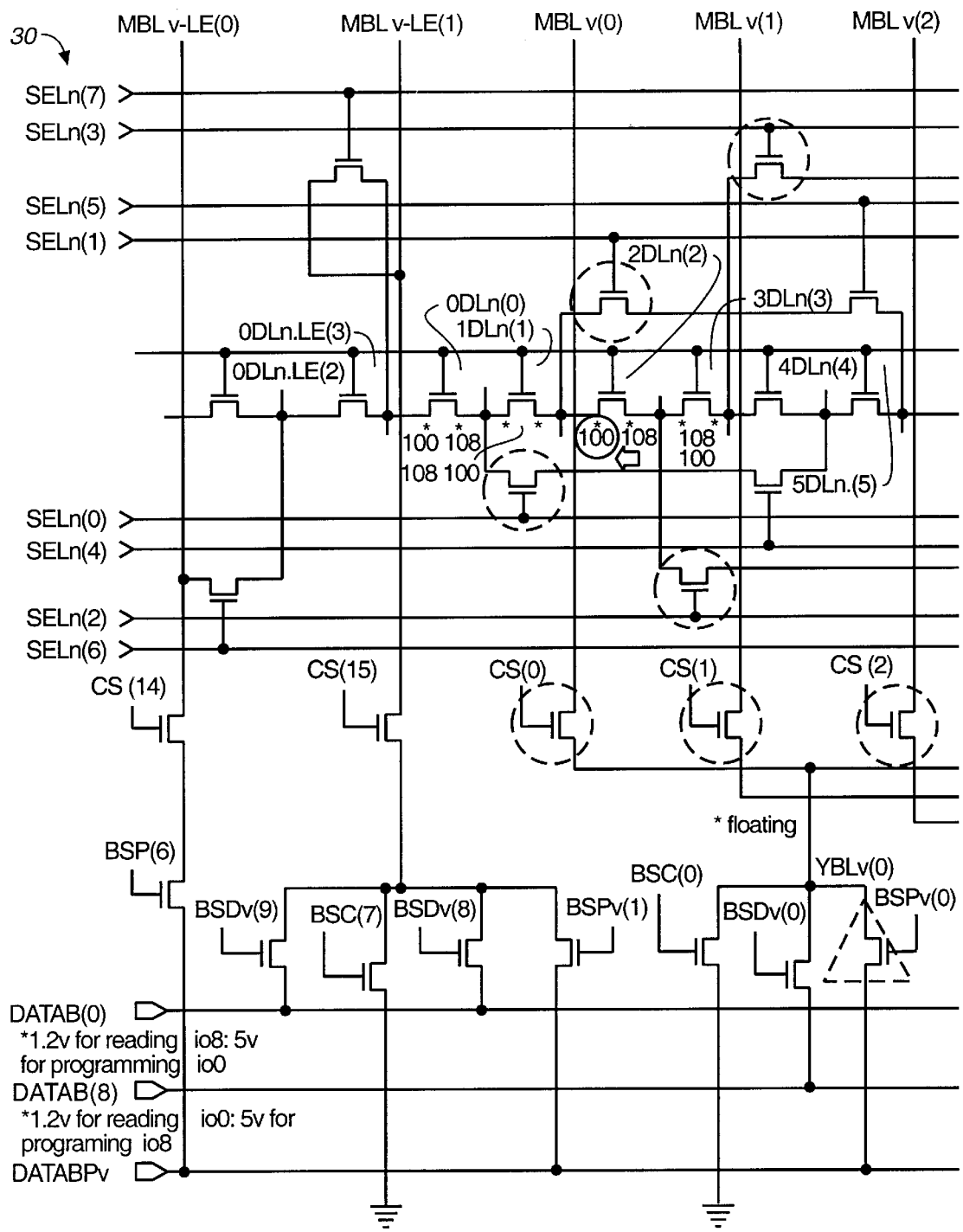
FIG._2A
FIG._2
FIG._2A | FIG._2B

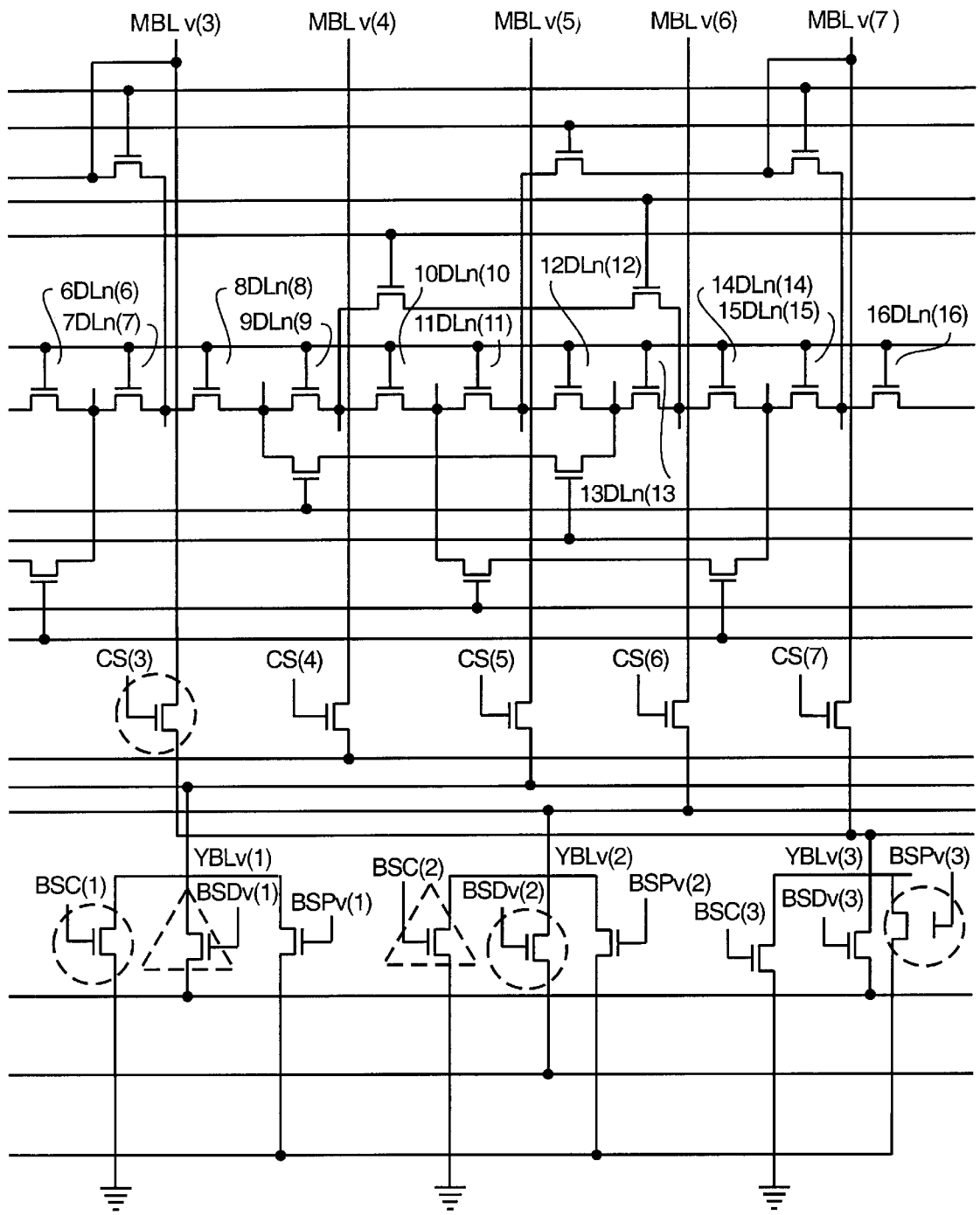
FIG._2B

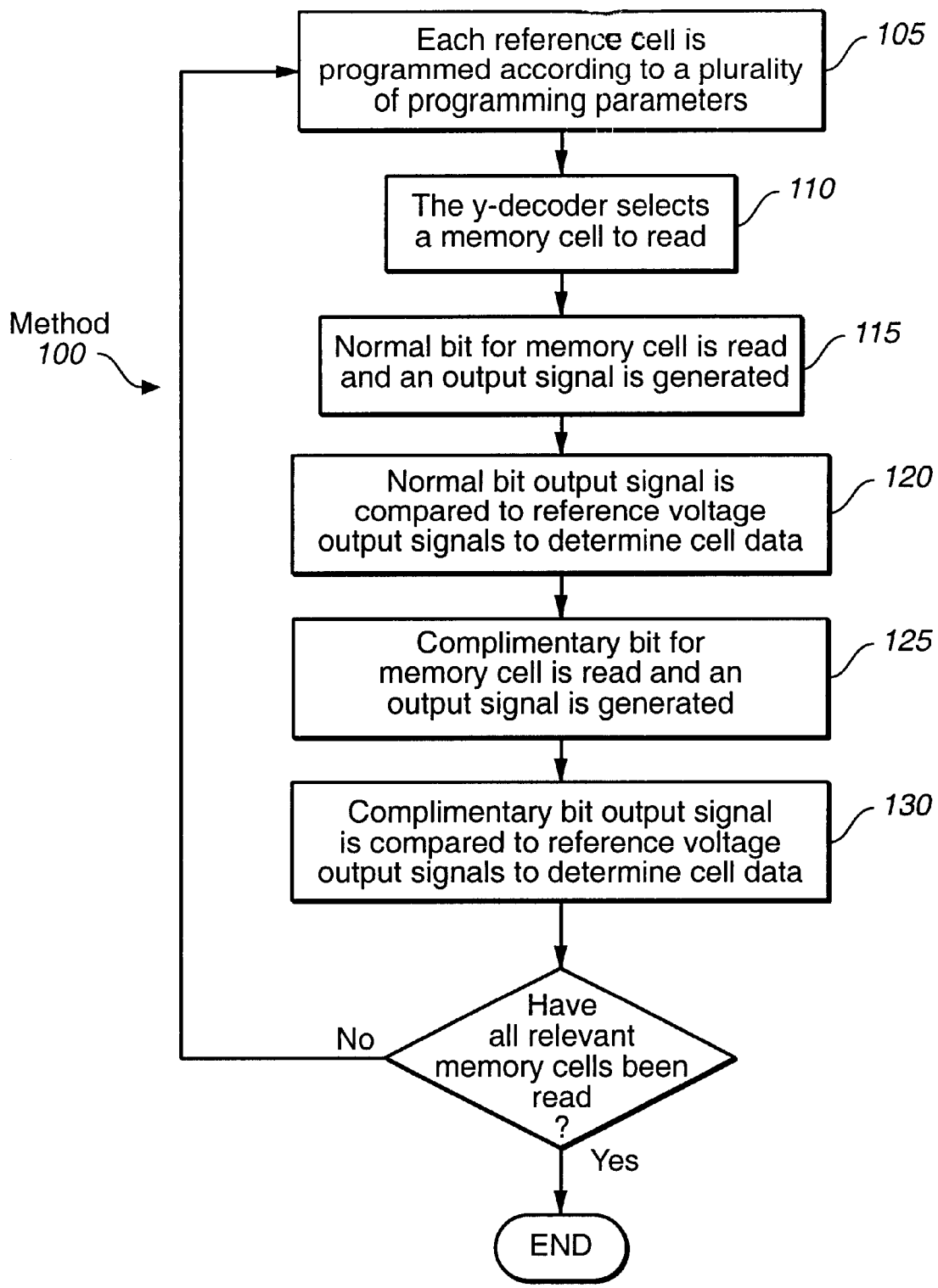
FIG._4

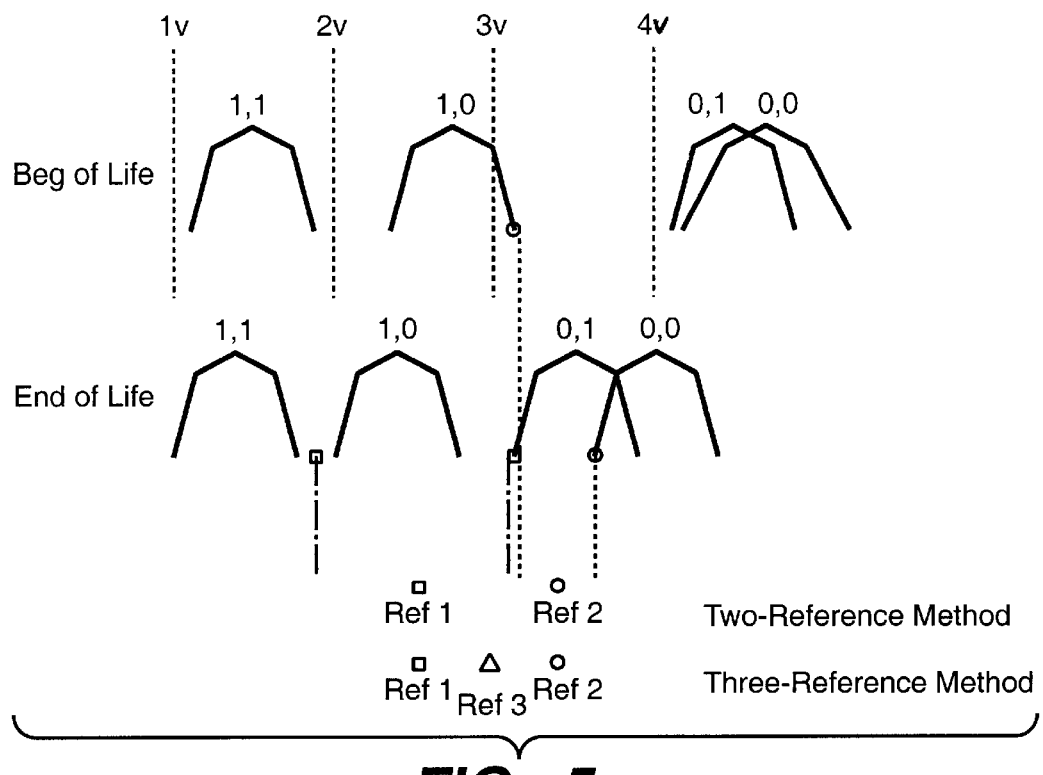
FIG._5
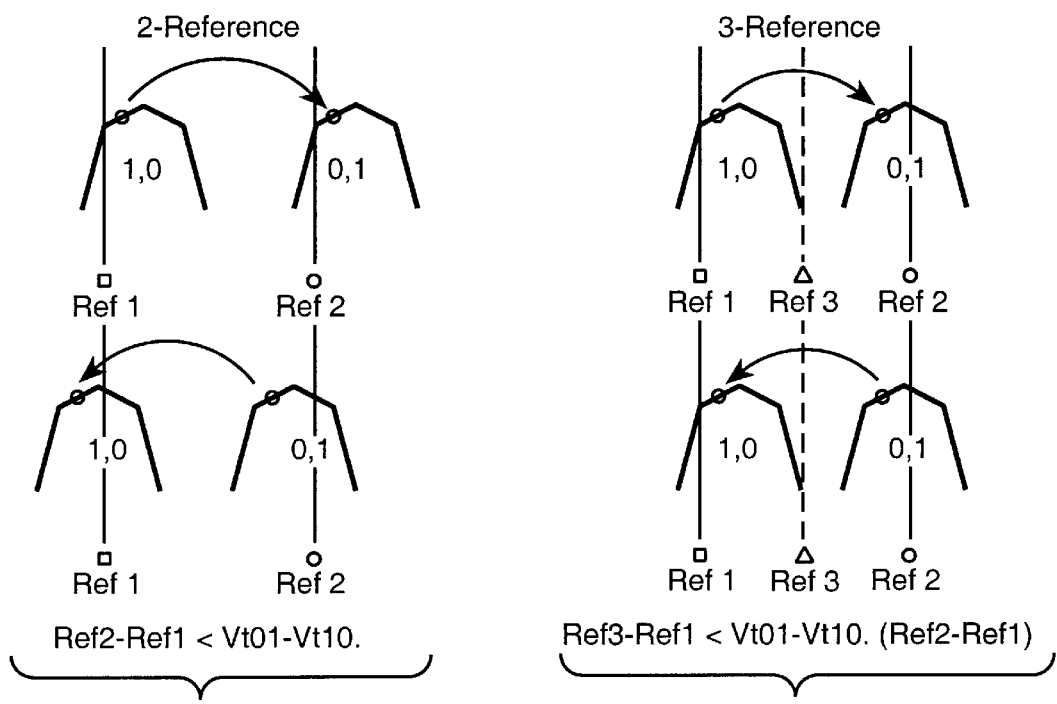
FIG._6  FIG._7

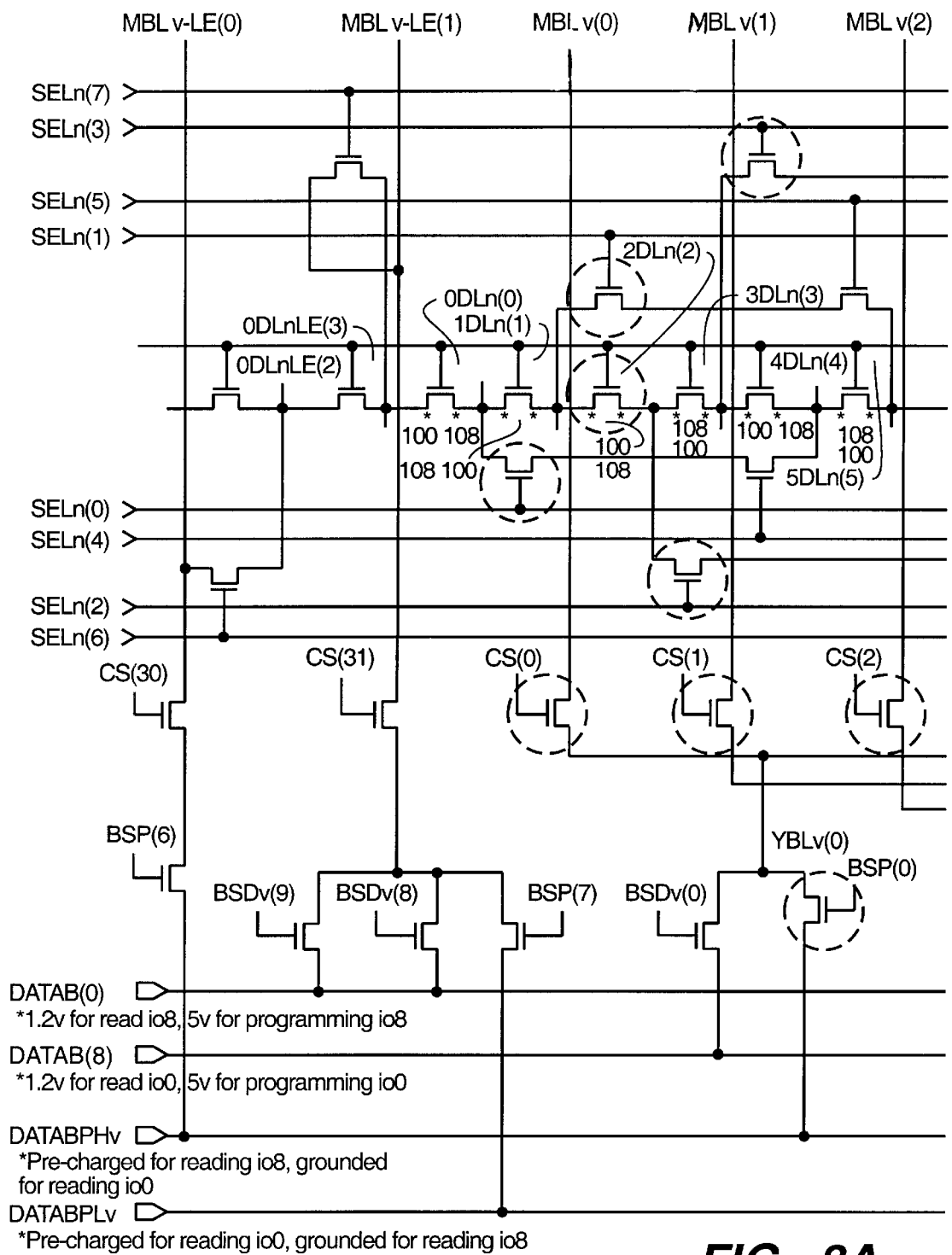
*FIG._8A*
*FIG._8*

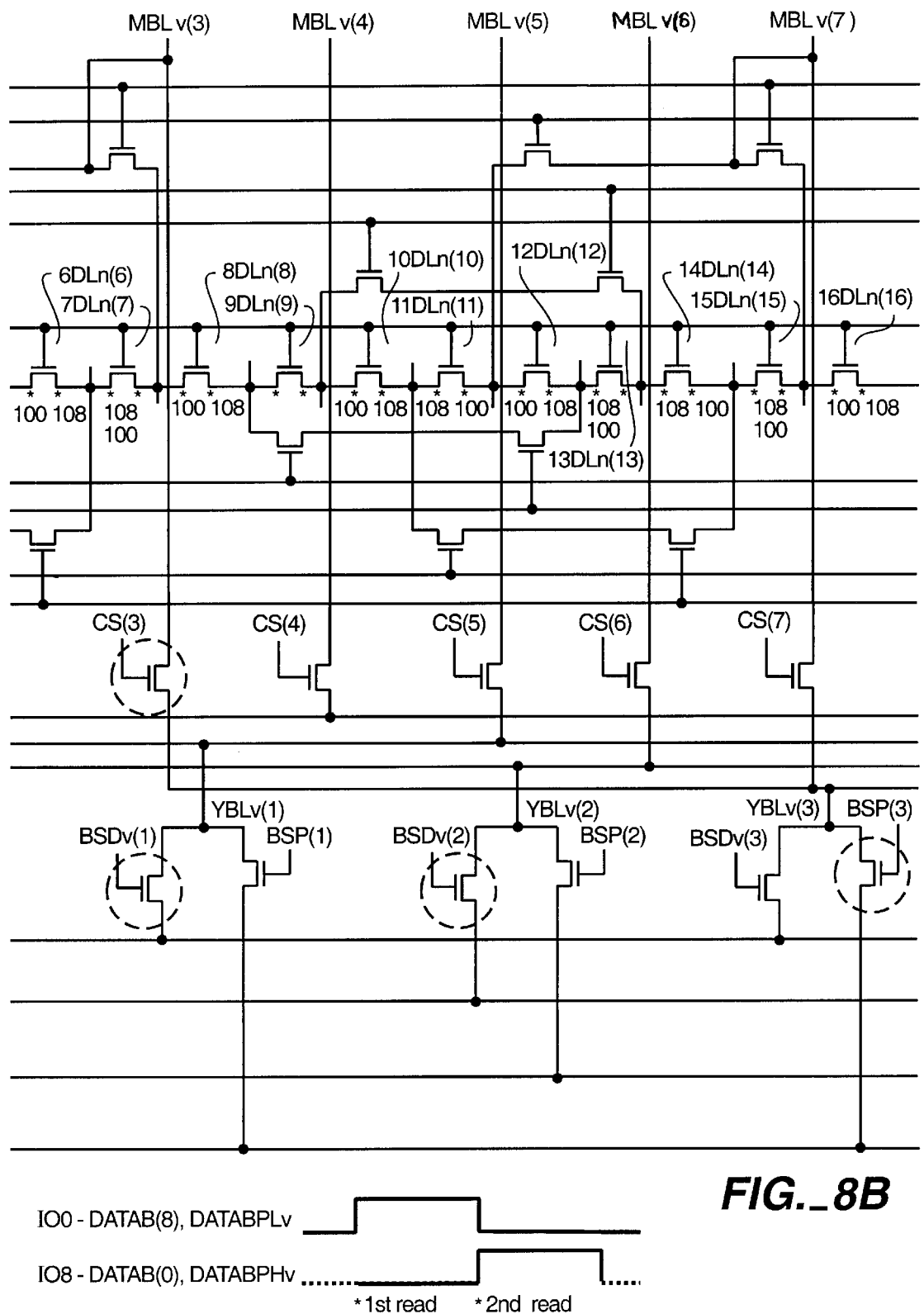
FIG._8B

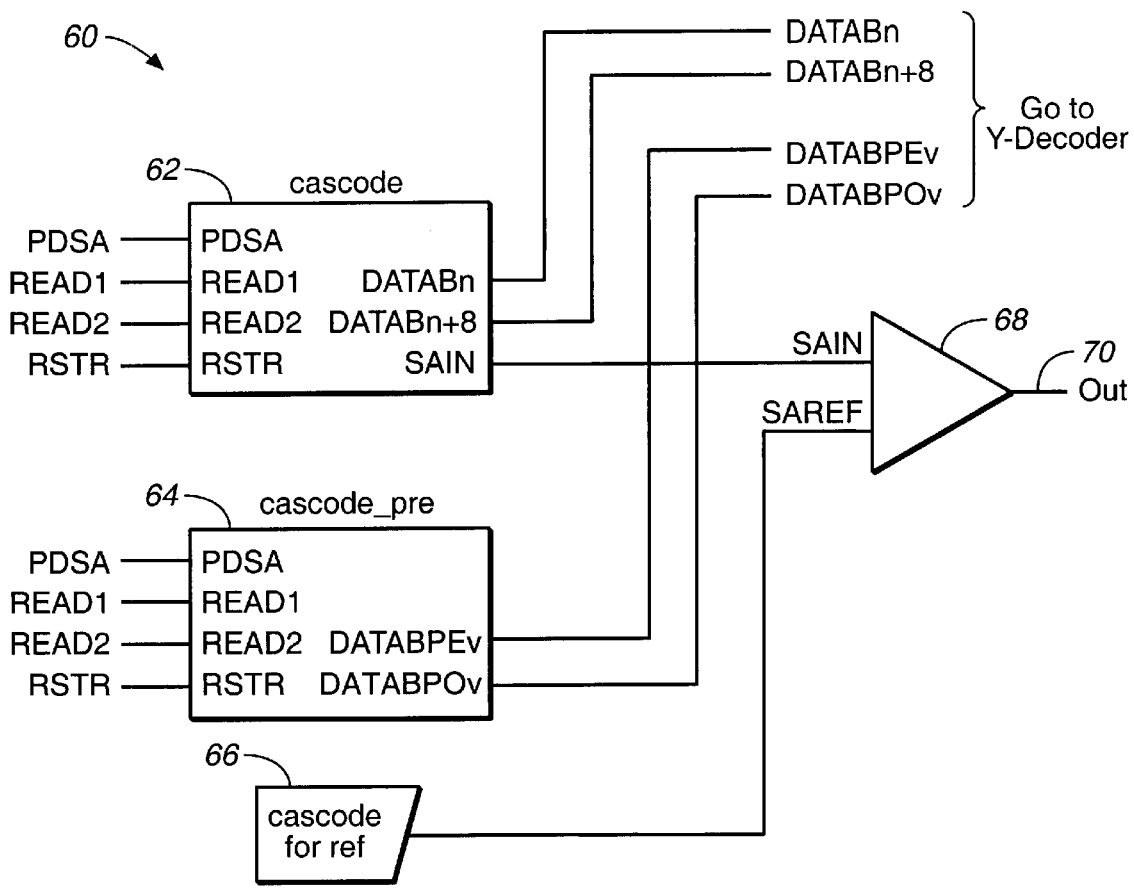
FIG._9

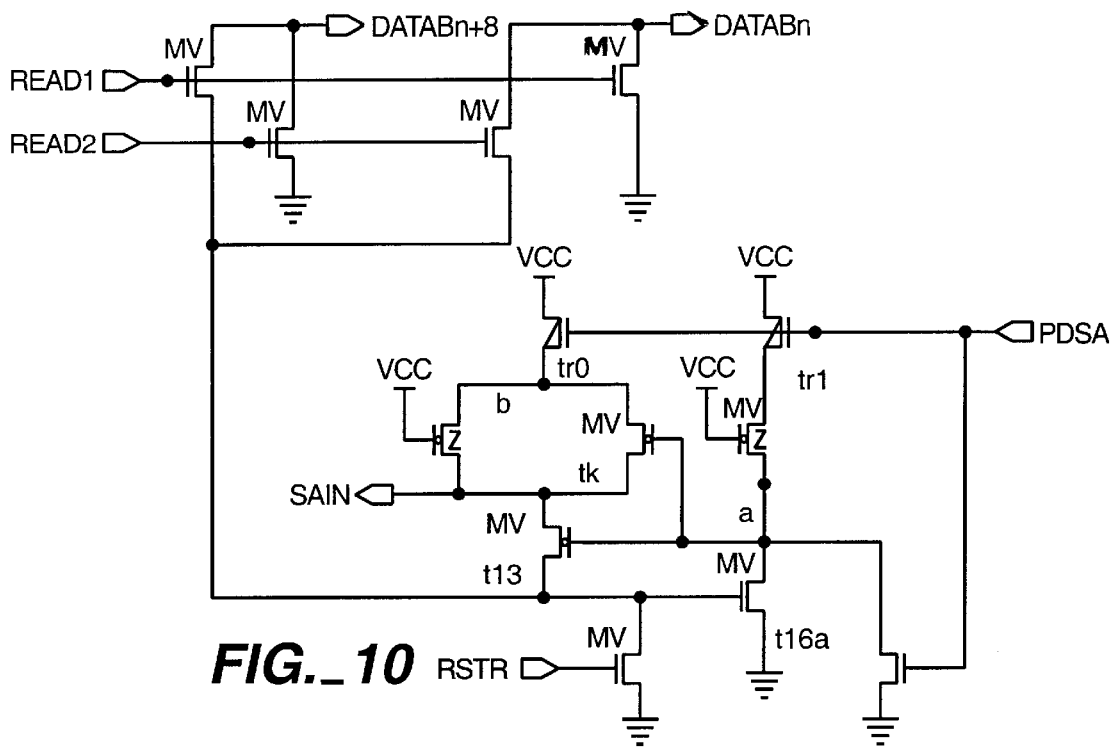
FIG._10
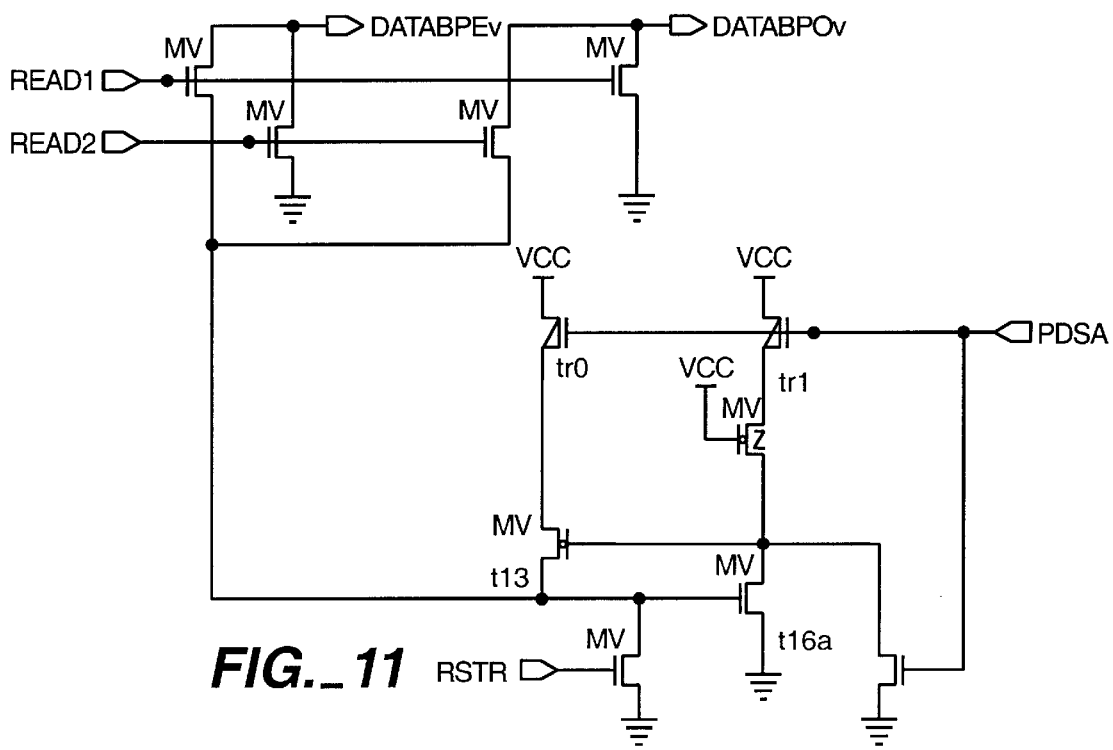
FIG._11

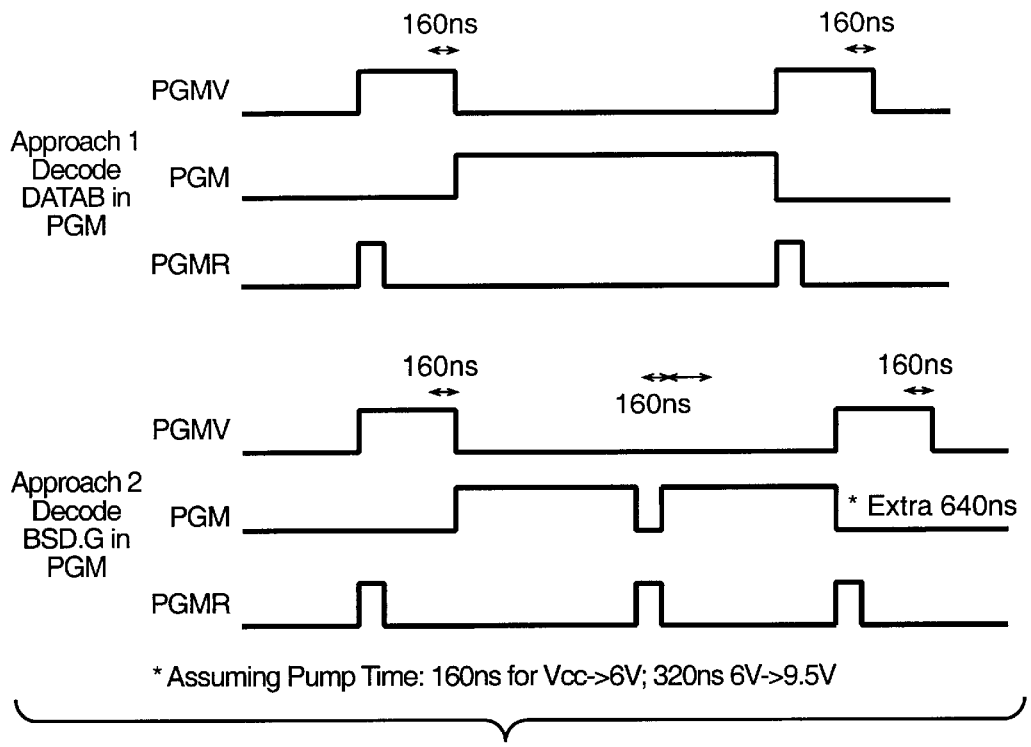
FIG._12
| 2 Bits / Cell | Byte Select | Byte Select for Red. | Column Select | Column Select for Red. | Total Number of Bus lines |
|---|---|---|---|---|---|
| In One IO | 8x3 | 4x3 | 16 | 11 | 63 |
| IN 2 IOs (Invention) | 8x2 | 4x2 | 32 | 11 | 67 |
| In 2 IOs (previous art) | 8x3 | 4x3 | 32 | 11 | 79 |
FIG._13

METHOD AND DEVICE FOR READING DUAL BIT MEMORY CELLS USING MULTIPLE REFERENCE CELLS WITH TWO SIDE READ

CROSS REFERENCE TO RELATED APPLICATIONS

This application claims the benefit of priority from a U.S. Provisional Patent Application entitled, "Method and Device for Reading Dual Bit Memory Cells Using Multiple Reference Cells With Two Side Read" filed on Jun. 20, 2001 and having application Ser. No. 60/300,916 now abandoned.

FIELD OF THE INVENTION

This invention relates to reading dual bit memory cells, and more specifically to a method for reading dual bit memory cells using multiple reference cells with two side read and a y-decoder device configured for the two side read.

BACKGROUND OF THE INVENTION

Conventional non-volatile memory such as flash memory has memory cells that each store multiple bits of data. One type of memory cell is a dual bit memory cell that can store two bits of data in a single cell. FIG. 1 is a structural illustration of a prior art dual bit memory cell. Memory cell 10 includes a gate 12, a storage nitride layer 14 having a left storage region 20 and a right storage region 22 each capable of storing one bit of data as a level of electron charge, e.g. 24, two n-type diffusions n1 and n2, in a substrate layer 16, that serve as a source or a drain depending upon whether the cell is being programmed, read or erased, and a channel region 18 in the substrate layer 16 between n1 and n2, wherein current may flow to indicate the state of the cell. The memory cell may also, instead of having a left and right nitride storage region, be configured with floating gates for charge storage.

To program charge 24, for example, in the right storage region 22, a high voltage, e.g. 8.5 to 10.5V, is placed on gate 12, between 4–6 volts is placed on n2, which while programming functions as the drain, and n1, which functions as the source, is grounded at 0V. The combination of these voltages on memory cell 10 causes channel hot electron injection that injects electrons into region 22 that localize near n2. To read charge 24 stored in memory cell 10, the roles of source and drain are reversed, between 3.5–4.5 V are placed on gate 12, between 1–1.6 V is placed on the drain n1, and the source n2 is grounded at 0V. If charge is stored, the threshold voltage ("Vt") of memory cell 10 will be close to the voltage of gate 12. This creates a small voltage differential that is insufficient to turn on memory cell 10, and little current flows through channel 18, thereby indicating a low programmed state or a programmed data bit "0". However, if no charge is stored, as is the case with respect to storage region 20, the Vt of the cell is much lower than the voltage on gate 12. This creates a large enough voltage differential to turn on memory cell 10. This allows a significantly larger current to flow through channel 18, indicating a high programmed state or an erased data bit "1".

A Y-decoder is used to read dual-bit memory cells in virtual ground architectures. Three selections are required in the y-decoding. The y-decoder needs to select a drain, a source, and a bit line next drain to pre-charge and hold voltage during read to avoid current from draining to the next bit line.

FIGS. 2A–2B illustrate a prior art y-decoder 30 for reading a dual-bit memory cell. Y-decoder 30 has byte select (BSx) and column select (CS) decoders. There are global metal bit lines (MBL) after the column select decoders, and local diffusion bit lines (DL) for each sector after sector select decoder (SELn). In order to have multiple selections, 4 sector select (out of 8), and 4 column select are selected. Moreover, to read one side of the memory cell, one BSD is selected for drain, one BSG is selected for grounding source, and one BSP is selected for pre-charging and holding the bit line voltage next to drain. Thus, six y-decoding selections are required, i.e., the circled and triangled transistors for BDS, BSG, and BSP in FIG. 2.

Since two bits of data may be stored in memory cell 10, it has four possible data states "11", "10", "01" and "00", and each state can be differentiated by setting the Vt of memory cell 10 to a certain value, i.e. by storing a certain level of charge in each storage region. In an array of such cells, the range of Vt to distinguish each state can be clearly identified at the beginning of the life of the memory cells when they are initially programmed, such that accurate data may be obtained when reading the cells. However, over time through the end of cell life, changes in the cell and other phenomena create inaccurate readings.

FIG. 3 illustrates an example of the Vt distributions for data stored in an array of memory cells. Graph 32 shows the Vt distributions for all four data states at the beginning of the cells' life, and graph 34 shows the Vt distributions for all four data states at the end of the cells' life. The graphs indicate a shift, a decrease, in the Vt distribution for all four data states. The Vt decreases due to loss of stored charge during cell life, which in turn lowers complimentary bit disturb. This complementary bit disturb phenomenon occurs when one side of a memory cell is programmed, wherein the Vt of the other side is increased. The harder one side is programmed, the more the Vt of the other side is increased.

The charge loss and resulting decrease in complementary bit disturb and shift in the Vt distributions presents a problem when reading data from the memory cells. As FIG. 3 illustrates, it is difficult to program a large enough Vt window between the data states to distinguish between a data "0" and a data "1" at the end of cell life. Therefore, at certain Vt it is difficult to distinguish between data states 01 and 10.

What is needed is a method for reading a dual bit memory cell that increases the chance of obtaining an accurate data reading throughout memory cell life, particularly at the end of the cell's life. What is also needed is a y-decoder architecture utilizing this more accurate reading method.

SUMMARY OF THE INVENTION

The present invention is directed at addressing the above-mentioned shortcomings, disadvantages, and problems. The present invention provides for a method for reading at least one programmed dual bit memory cell using a plurality of programmed dual bit reference cells, each said memory and reference cell comprising a left storage region for storing a first data bit as a level of electron charge and a right storage region for storing a second data bit as a level of electron charge, each said storage region comprising either a low programmed state (a data bit 0) wherein said electron charge is stored in said storage region or a high programmed state (a data bit 1) wherein no said electron charge is stored in said storage region, wherein each said cell has four possible data states 00, 01, 10, and 11, said method comprising.the steps of: (a) programming said reference cells according to a plurality of programming parameters, wherein said first and second data bits of said selected programmed memory cell are determined by reading said first and second data bits of said programmed reference cells; (b) selecting one of the said memory cells to read and determine said selected memory cell's data; (c) reading said left bit of said selected memory cell and generating a left bit output signal; (d) comparing said left bit output signal to at least one reference cell output signal to determine said memory cell data; (e) reading said right bit of said selected memory cell and generating a right bit output signal; (f) comparing said left bit output signal to at least one reference cell output signal to determine said memory cell data; and (g) determining if at least one other said memory cell should be read, and if so repeating steps (b) through (f).

In one embodiment of the present invention, the method is implemented using two corresponding reference cells to determine the data stored in one programmed memory cell. In another embodiment of the present invention, the method is implemented using three corresponding reference cells to determine the data stored in one programmed memory cell.

A key advantage of the method of reading dual-bit memory cells according to the present invention is more accurate memory cell reading over the life of the memory device.

The present invention also provides for a y-decoder architecture used to read the dual-bit memory cells. There are two key advantages to the y-decoder architecture according to the present invention. One advantage is that it uses less byte select lines as well as byte select transistors as you write. The other is that it requires less program time.

BRIEF DESCRIPTION OF THE DRAWINGS

The foregoing aspects and attendant advantages of the present invention will become more readily appreciated by reference to the following detailed description, when taken in conjunction with the accompanying drawings, wherein:

FIG. 1 is a structural illustration of a prior art dual bit memory cell;

FIGS. 2A–2B illustrate a prior y-decoder for reading a dual-bit memory cell;

FIG. 3 illustrates an example of the $V_t$ distributions for data stored in an array of memory cells;

FIG. 4 illustrates a method for reading at least one programmed dual-bit memory cell according to a preferred embodiment of the present invention;

FIG. 5 illustrates the programming parameters for Ref1, Ref2 and Ref3;

FIG. 6 illustrate s the programming parameters for Ref1 and Ref2;

FIG. 7 illustrates the programming parameters for Ref1, Ref2, and Ref3;

FIGS. 8A–8B illustrate a y-decoder 50 according to a preferred embodiment of the present invention;

FIG. 9 illustrates block diagram of a circuit 60 used to supply DATABn, DATABn+8, and DATABPqv signals to the y-decoder, and to provide the inputs SAIN and SAREF to sense amplifier 68, to determine OUT 70, which determines the data in the memory cell being read;

FIG. 10 illustrates Cascode 62, according to the present invention. Cascode 62 provides drain voltage for read;

FIG. 11 illustrates Cascode_pre 64, according to the present invention. Cascode_pre 64 provides the voltage for pre-charge;

FIG. 12 illustrates two programming approaches that show one advantage of a y-decoder in accordance with the present invention.

FIG. 13 illustrates a chart comparing the total number of bus lines needed for the present invention and the prior art.

DETAILED DESCRIPTION OF THE INVENTION

The present invention provides for a method of reading dual-bit memory cells using a plurality of reference cells. Each memory cell and reference cell is preferably of the type illustrated in FIG. 1, having a left and right nitride storage region capable of storing a normal and complimentary data bit, respectively. Although storage regions comprised of a nitride layer are preferred, one of ordinary skill in the art will readily realize that the detailed method discussed herein can be modified for implementation with cells comprising storage regions that are floating gates. The memory cells are arranged in an array, to form a memory device. One embodiment of this invention uses two reference cells and another embodiment uses three reference cells FIG. 4 illustrates a method 100 for reading at least one programmed dual-bit memory cell, according to a preferred embodiment of the present invention. At step 105, each reference cell is programmed according to a plurality of programming parameters. The programming parameters are discussed in detail below and depend upon the number of references being programmed for a given memory device. The programming technique discussed above is preferably used, wherein the gate programming voltage is 9.5 volts, and the drain programming voltage is 5 volts.

At step 110, the y-decoder selects a memory cell to read, and reads the cell's normal bit to generate a normal bit output signal, at step 115. This output signal is generally a current that is converted to a voltage. The preferred circuits used in programming and reading the memory cells are illustrated in FIGS. 10–13, and are discussed in detail below. The technique for reading a dual-bit cell discussed above is preferably used, wherein the gate reading voltage is 4.2 volts, and the drain reading voltage is 1.2 volts. At step 120, the memory cell's normal bit signal is compared to output voltage signals generated by a reference cell cascade circuit, to determine the normal bit cell data. The cascade circuit for generating the reference cell output signal is known by those of ordinary skill in the art.

At step, 125, the selected memory cell's complimentary bit data is read, to generate a complimentary bit output signal. The memory cell's complimentary bit output signal is compared to output voltage signals generated by the reference cells, at step 130, to determine the complimentary bit cell data. Finally, at step 135, it is determined whether any additional memory cells need to be read. If so, then steps 110 through 135 are repeated until all relevant memory cells have been read.

As mentioned earlier, one embodiment of the present invention uses two programmed reference cells, Ref1 and Ref2, to determine memory cell data. In this embodiment, Ref1 and Ref2 are programmed and their Vt set according to the following programming parameters, to accurately determine the content of memory cells from the beginning to the end of the life of the memory device. These programming parameters are determined based upon the Vt distributions for the memory cell data at the beginning and end of life, as shown in FIGS. 5 and 6, and further illustrated below in Table 1 below:

TABLE 1

| Data | Beginning of life (BOL) | End of Life (EOL) |
|------|------------------------|-------------------|
| 11   | Max. 1.7v              | Max. 1.5v         |
| 10   | Max. 3.2v              | Max. 2.2v         |
| 01   | Min. 4.2v              | Min. 2.9v         |
| 00   | Min. 4.2v              | Min. 3.4v         |

The programming parameters implement the following conditions:

(1) programming Ref1 lower than Ref2;
(2) programming Ref1 between the Vts for data 11 at BOL and data 01 at EOL, wherein Ref1 reads 1 for memory cell data 11 at EOL, and 0 for memory cell data 01 at EOL;
(3) programming Ref2 between the Vts for data 00 at EOL and data 10 at BOL, wherein Ref2 reads 0 for memory cell data 00 at EOL and 1 for memory cell data 10 at EOL; and
(4) programming delta Vt between Ref1 and Ref2 less than delta Vt between normal and complimentary bits for cell data 01 or 10, i.e. Vt of Ref2–Vt of Ref1< (Vt01–Vt10), wherein if normal bit reference data is 01, complimentary bit reference data needs to read 00 for memory cell data 10, and 11 for memory cell data 01. Preferably Ref1 is set to 2.30 V and Ref2 is set to 3.45 V.

Programming Ref1 and Ref2 according to the above parameters corresponds to the normal and complimentary bit data for Ref1 and Ref2, respectively for each memory cell data state as shown below in Table 2.

TABLE 2

| Memory Cell Data | Normal Bit Data | Complimentary Bit Data |
|------------------|-----------------|------------------------|
| 1, 1             | 1, 1            | 1, 1                   |
| 1, 0             | 1, 1 or 0, 1    | 0, 1 or 0, 0           |
| 0, 1             | 0, 1 or 0, 0    | 1, 1 or 0, 1           |
| 0, 0             | 0, 0            | 0, 0                   |

Memory cell data can then be determined by reading the normal and complimentary bits of Ref1 and Ref2, in accordance with Table 3.

TABLE 3

| Normal Bit | | Complimentary Bit | | |
|---|---|---|---|---|
| Ref1 | Ref2 | Ref1 | Ref2 | Cell Data |
| 1 | 1 | 1 | 1 | 1, 1 |
| 1 | 1 | 0 | 1 | 1, 0 |
| 1 | 1 | 0 | 0 | 1, 0 |
| 0 | 1 | 1 | 1 | 0, 1 |
| 0 | 1 | 0 | 1 | N/A |
| 0 | 1 | 0 | 0 | 1, 0 |
| 0 | 0 | 1 | 1 | 0, 1 |
| 0 | 0 | 0 | 1 | 0, 1 |
| 0 | 0 | 0 | 0 | 0, 0 |

Table 3 illustrates one other important parameter, Vt for Ref1 and Ref2 cannot be set such that normal bit data for Ref1 and Ref2 is 0 and 1 respectively and complimentary bit data for Ref1 and Ref2 is 0 and 1 respectively.

In another embodiment of the present invention, three programmed reference cells, Ref1, Ref2 and Ref3 are used to determine memory cell data. This method provides even greater flexibility in reference Vt settings. FIGS. 5 and 7 illustrate the programming parameters for Ref1, Ref2 and Ref3. The programming parameters include:

(1) programming Ref1 lower than Ref2;
(2) programming Ref3 between Ref1 and Ref2, wherein (Vt of Ref2–Vt of Ref1)>(Vt of Ref3–Vt of Ref1) or (Vt of Ref2–Vt of Ref3);
(3) programming Ref1 between the Vt for data 11 at BOL and data 01 at EOL, wherein Ref1 reads 1 for memory cell data 11 at EOL and 0 for memory cell data 01 at EOL;
(4) programming Ref2 between the Vt for data 00 at EOL and data 10 at BOL, wherein Ref2 reads 0 for memory cell data 00 at EOL and 1 for memory cell data 10 at EOL; and
(5) programming delta Vt between Ref1 and Ref3 or between Ref2 and Ref3 less than delta Vt between normal and complimentary bits for cell data 01 or 10, i.e. (Vt of Ref3–Vt of Ref1)<(Vt01–Vt10) or (Vt of Ref2–(Vt of Ref3.)<(Vt01–Vt10), wherein if normal bit data for Ref1 and Ref2 respectively is 01, complimentary bit data for Ref3 needs to read 0 for memory cell data 10 and 1 for memory cell data 01. Preferably Ref1 is set to 2.30 V, Ref2 is set to 3.45 V, and Ref3 is set to 2.88 V.

Programming Ref1, Ref2 and Ref3 according to the above parameters corresponds to the normal and complimentary bit data for Ref1, Ref3 and Ref2, respectively, for each memory cell data state as shown below in Table 4.

TABLE 4

| Memory Cell Data | Normal Bit Data | Complimentary Bit Data |
|------------------|-----------------|------------------------|
| 1, 1 | 1, 1, 1 | 1, 1, 1 |
| 1, 0 | 1, 1, 1 or | 0, 1, 1 or |
|      | 0, 1, 1 or | 0, 0, 1 or |
|      | 0, 0, 1    | 0, 0, 0    |
| 0, 1 | 0, 1, 1 or | 1, 1, 1 or |
|      | 0, 0, 1 or | 0, 1, 1 or |
|      | 0, 0, 0    | 0, 0, 1    |
| 0, 0 | 0, 0, 0    | 0, 0, 0    |

Memory cell data can then be determined by reading the normal and complimentary bits of corresponding Ref1, Ref2 and Ref3, in accordance with Table 5.

TABLE 5

| Normal Bit | | | Complimentary Bit | | | Cell |
|---|---|---|---|---|---|---|
| Ref1 | Ref3 | Ref2 | Ref1 | Ref3 | Ref2 | Data |
| 1 | 1 | 1 | 1 | 1 | 1 | 1, 1 |
| 1 | 1 | 1 | 0 | 1 | 1 | 1, 0 |
| 1 | 1 | 1 | 0 | 0 | 1 | 1, 0 |
| 1 | 1 | 1 | 0 | 0 | 0 | 1, 0 |
| 0 | 1 | 1 | 1 | 1 | 1 | 0, 1 |
| 0 | 1 | 1 | 0 | 1 | 1 | N/A |
| 0 | 1 | 1 | 0 | 0 | 1 | 1, 0 |
| 0 | 1 | 1 | 0 | 0 | 0 | 1, 0 |
| 0 | 0 | 1 | 1 | 1 | 1 | 0, 1 |
| 0 | 0 | 1 | 0 | 1 | 1 | 0, 1 |
| 0 | 0 | 1 | 0 | 0 | 1 | N/A |
| 0 | 0 | 1 | 0 | 0 | 0 | 1, 0 |
| 0 | 0 | 0 | 1 | 1 | 1 | 0, 1 |
| 0 | 0 | 0 | 0 | 1 | 1 | 0, 1 |
| 0 | 0 | 0 | 0 | 0 | 1 | 0, 1 |
| 0 | 0 | 0 | 0 | 0 | 0 | 0, 0 |

Table 5 illustrates two other important parameters. First, Vt for Ref1, Ref2 and Ref3 cannot be set such that normal bit data for Ref1, Ref3 and Ref2 is 0,1 and 1 respectively and complimentary bit data for Ref1, Ref3 and Ref2 is 0, 1 and 1 respectively. In addition, Vt for Ref1, Ref3 and Ref2 cannot be set such that normal bit data for Ref1, Ref3 and Ref2 is 0,0 and 1 respectively and complimentary bit data for Ref1, Ref3 and Ref2 is 0, 0 and 1 respectively.

FIGS. 8A–8B illustrate a y-decoder 50 according to a preferred embodiment of the present invention for use in programming and reading dual bit cells. The y-decoder 50 comprises a DATAB(n), e.g. DATAB(0), and a DATAB(n+ 8), e.g. DATAB(8) for decoding a drain voltage in read for the normal and complimentary data bits. For programming, read drain and program drain are swapped, i.e. DATABn is the drain for programming IOn, and DATABn+8 or DATABn−8 is the drain for reading IOn. The y-decoder 50 also comprises a DATABPqv (q being L or H for low or high byte) for decoding a pre-charge voltage in read. DATABn and DATABPqv are decoded to read two bits in one cell instead of decoding the byte select, as the prior art y-decoder does.

As illustrated in FIG. 8, two BSD are selected for drain and source. Two BSP are selected for pre-charging the bit line next to drain and grounding the bit line next to source. While one of DATABn or DATABPqv is selected, the other DATABn or DATABPqv is grounded.

FIG. 9 illustrates a block diagram of a circuit 60 used to supply DATABn, DATABn+8, and DATABPqv signals to the y-decoder 50. The circuit 60 also provides inputs SAIN and SAREF to sense amplifier 68 to determine OUT 70, which determines the data in the memory cell being read.

FIG. 10 illustrates one embodiment for.Cascode 62 according to the present invention. Cascode 62 provides drain voltage for read. Memory cell current is transferred to SAIN voltage. When cell current is small (data 0), SAIN is relatively high. When cell current is large (data 1), SAIN is relatively low. SAIN is compared with SAREF, which is cascode output for reference cell to determine a, memory cell data.

In Cascode 62, during first read (READ1=H), DATABn is 1.2 v while DATABn+8 is grounded. During second read (READ2=H), DATABn is grounded while DATABn+8 is 1.2 v.

FIG. 11 illustrates one embodiment for Cascode_pre 64 according to the present invention. Cascode_pre 64 provides the voltage for pre-charge. During first read (READ1= H), DATABPEv is 1.2 v while the DATABPOv is grounded. During second read (READ2=H), DATABPEv is grounded while the DATABPOv is 1.2 v.

In order to program two bits in one cell, two pulses are required in order to switch source and drain for the two bits. Because of limited pump capability, we program some bits out of 16 bits at the same time. If we program 4 bits at the maximum, there will be 4 sub-programs in one program pulse. Therefore, the y-decoder of the subject invention does not require extra sub-programming pulses.

FIG. 12 illustrates two programming approaches. Approach 1 is for the y-decoder according to the present invention. Approach 2 is for the prior art y-decoder. Approach 1 does not need discharge time between the two sub-programs, while Approach 2 needs the discharge time. For example, assuming a pump time of. 160 ns for Vcc to 6 volts, and 480 ns for 6 volts to 9.5 volts, the result is an extra 640 ns as shown.

FIG. 13 illustrates a chart comparing the total number of bus lines needed for the present invention and the prior art. The figure illustrates that fewer bus lines and fewer byte selects are required in the y-decoder of the present invention.

For instance, when putting two bits in one IO, one IO has 64 diffusion bit lines (cells) and 128 bits. For putting 2 bits per cell in different IOs, two IOs are combined together, so that one IO block, which is made of two IOs, has 128 diffusion bit lines and 256 bits. The prior art y-decoder requires doubling both column select and byte select.

The method for reading dual bit memory cells using multiple reference cells with two side read and a y-decoder device configured for the two side read described in the text above were chosen as being illustrative of the best mode of the present invention. All embodiments of the present invention described above are illustrative of the principles of the invention and are not intended to limit the invention to the particular embodiments described. Accordingly, while the preferred embodiment of the invention has been illustrated and described, it will be appreciated that various changes can be made therein without departing from the spirit and scope of the invention as claimed.

What is claimed is:

1. A method for reading at least one programmed dual bit memory cell using a plurality of programmed dual bit reference cells, each said memory and reference cell comprising a left storage region for storing a first data bit as a level of electron charge and a right storage region for storing a second data bit as a level of electron charge, each said storage region comprising either a low programmed state (a data bit 0) wherein said electron charge is stored in said storage region or a high programmed state (a data bit 1) wherein no said electron charge is stored in said storage region, wherein each said cell has four possible data states 00, 01, 10, and 11, said method comprising the steps of:

(a) programming said reference cells according to a plurality of programming parameters, wherein said first and second data bits of said selected programmed memory cell are determined by reading said first and second data bits of said programmed reference cells;

(b) selecting one of the said memory cells to read and determine said selected memory cell's data;

(c) reading said left bit of said selected memory cell and generating a left bit output signal;

(d) comparing said left bit output signal to at least one reference cell output signal to determine said memory cell data;

(e) reading said right bit of said selected memory cell and generating a right bit output signal;

(f) comparing said left bit output signal to at least one reference cell output signal to determine said memory cell data; and (g) determining if at least one other said memory cell should be read, and if so repeating steps (b) through (f).

2. The method of claim 1, wherein the plurality of programmed reference cells comprise a first reference cell (Ref1) and a second reference cell (Ref2).

3. The method of claim 2, wherein the step of programming said reference cells comprises steps of:

programming a voltage threshold for Ref1 lower than, a voltage threshold for Ref2;

programming the voltage threshold for Ref1 between a voltage threshold for memory cell data 11 at BOL and memory cell data 01 at EOL, wherein Ref1 reads 1 for memory cell data 11 at EOL, and 0 for memory cell data 01 at EOL;

programming the voltage threshold for Ref2 between a voltage threshold for memory cell data 00 at EOL and memory cell data 10 at BOL, wherein Ref2 reads 0 for memory cell data 00 at EOL and 1 for memory cell data 10 at EOL; and programming a delta voltage threshold between Ref1 and Ref2 less than a delta voltage threshold between normal and complimentary bits for memory cell data 01 or 10, wherein if normal bit reference data is 01 then complimentary bit reference data is 00 for memory cell data 10, and 11 for memory cell data 01.

4. The method of claim 3, wherein Ref1 is set to 2.30 V and Ref2 is set to 3.45 V.

5. The method of claim 1, wherein the plurality of programmed reference cells comprise a first reference cell (Ref1) and a second reference cell (Ref2) and a third reference cell (Ref3).

6. The method of claim 5, wherein the step of programming said reference cells comprises steps of:

programming a voltage threshold of Ref1 lower than a voltage threshold of Ref2;

programming a voltage threshold (Vt) of Ref3 between the voltage thresholds of Ref1 and Ref2, wherein:

(Vt of Ref2–Vt of Ref1)>(Vt of Ref3–Vt of Ref1);

programming the Vt of Ref1 between the Vt for memory cell data 11 at BOL and memory cell data 01 at EOL, wherein the Vt of Ref1 reads 1 for memory cell data 11 at EOL and 0 for memory cell data 01 at EOL;

programming the Vt of Ref2 between the Vt for memory cell data 00 at EOL and memory cell data 10 at BOL, wherein the Vt of Ref2 reads 0 for memory cell data 00 at EOL and 1 for memory cell data 10 at EOL; and programming a delta Vt between Ref1 and Ref3 or between Ref2 and Ref3 to be less than a delta Vt between normal and complimentary bits for memory cell data 01 or 10, wherein if normal bit data for Ref1 and Ref2 respectively is 01, complimentary bit data for Ref3 reads 0 for memory cell data 10 and 1 for memory cell data 01.

7. The method of claim 6, wherein the Vt of Ref1 is set to 2.30 V, the Vt of Ref2 is set to 3.45 V, and the Vt of Ref3 is set to 2.88 V.

8. The method of claim 1, wherein said storage regions comprise a nitride layer.

9. The method of claim 1, wherein said storage regions comprise a floating gate.

10. A method for reading a selected programmed dual bit memory cell using a plurality of programmed dual bit reference cells, each said memory and reference cell comprising a left storage region for storing a first data bit as a level of electron charge and a right storage region for storing a second data bit as a level of electron charge, each said storage region comprising either a low programmed state (a data bit 0) wherein said electron charge is stored in said storage region or a high programmed state (a data bit 1) wherein no said electron charge is stored in said storage region, wherein each said cell has four possible data states 00, 01, 10, and 11, said method comprising the steps of:

programming said reference cells according to a plurality of programming parameters, wherein the programming parameters are selected to compensate for a life characteristic of the selected programmed dual bit memory cell; and determining said first and second data bits of said selected programmed memory cell based on said first and second data bits of said plurality of programmed reference cells.

11. The method of claim 10, wherein the step of determining comprises steps of:

reading said left bit of said selected memory cell to generate a left bit output signal;

comparing said left bit output signal to at least one reference cell output signal to determine said memory cell data;

reading said right bit of said selected memory cell and generating a right bit output signal; and comparing said left bit output signal to at least one reference cell output signal to determine said memory cell data.

12. Apparatus for reading a programmed dual bit memory cell comprising:

a first dual bit reference cell that is programmed according to a first set of programming parameters to compensate for a life characteristic of the programmed dual bit memory cell;

a second dual bit reference cell that is programmed according to a second set of programming parameters to compensate for the life characteristic of the programmed dual bit memory cell; and a y-decoder circuit operable to select the first and second reference cells so that data from the first and second reference cells are used to read said programmed dual bit memory cell.

* * * * *